358-86. XR 3,555,430 SR

T. L. FISCHER ET AL 3,555,430

TELEVISION RECEIVER CONVERTER

Original Filed Feb. 23, 1966

TX 5000
X 5113
RK

INVENTORS.
THOMAS L. FISCHER
STANLEY C. FORREST, JR.
By White & Haefliger
ATTORNEYS.

United States Patent Office
3,555,430
Patented Jan. 12, 1971

3,555,430

TELEVISION RECEIVER CONVERTER

Thomas L. Fischer and Stanley C. Forrest, Jr., Santa Ana, Calif., assignors, by mesne assignments, to Anaconda Wire and Cable Company, New York, N.Y., a corporation of Delaware Continuation of application Ser. No. 529,546, Feb. 23, 1966. This application Apr. 22, 1969, Ser. No. 818,450
Int. Cl. H04b 1/06, 1/26
U.S. Cl. 325—439 16 Claims

ABSTRACT OF THE DISCLOSURE

The disclosure concerns various unusually effective ways in which VHF, or VHF and UHF, signals may be transmitted by coaxial cable as VHF and then converted to UHF and supplied to a television receiver, together with tuning thereof by local or auxiliary UHF tuning means.

This is a continuation of U.S. application Ser. No. 529,546 filed Feb. 23, 1966, and now abandoned.

This invention relates generally to cable television, and more particularly concerns the solution to problems arising by virtue of use of cable input of VHF channel signals to television receivers operated in areas where the same VHF signals are transmitted for receiver antenna reception.

In the areas referred to above, it often happens that the quality of the image produced by the picture tube in response to the VHF cable input is poor due to direct pick-up of VHF signals by the receiver RF circuits and input leads. Such poor quality or ghosting results from the out-of-phase condition of the cable transmitted VHF signals and those picked up by the receiver itself as transmitted by local antennas at the same channel frequency.

The present invention contemplates a simple, easy-to-install and inexpensive solution to the above problem. Basically, it involves utilization of the receiver UHF tuner as a means to tune the VHF channels. More specifically, and in its combination aspects, the invention comprises a television receiver having VHF and UHF tuning means for tuning VHF and UHF channels, means including a coaxial cable connected for conducting VHF signals toward the receiver input terminal, and means connected in series between the cable and the receiver input terminal for converting the VHF signals to UHF signals so that the UHF tuning means may be operated to tune the VHF channels for display by the receiver picture tube. Typically, the converting means includes a local oscillator together with a modulator having an input to receive the output from the local oscillator and another input to receive amplified or unamplified versions of the cable transmitted VHF signals, the oscillator output frequency being such that the modulator output is within the UHF band.

Other features and advantages of the invention include the provision of VHF channel indicators at the UHF tuner; selectively operable by-pass means to by-pass the cable transmitted VHF signals around the converter for directly supplying the signals to the receiver input terminal under conditions when the converter is not needed; and the provision of a converter as described for combination with a television receiver.

Another benefit derived from the invention is the effective extension of available VHF channels beyond 12 in number. Thus, for example, means may be provided to transmit to the cable VHF signals outside the channel 2–13 frequency range, i.e. outside the 54 to 88 megacycle band for channels 2 to 6 and outside the 174 to 216 megacycle band for channels 7–13. The converter enables UHF tuning of such additional VHF frequencies, as will be described.

These and other objects and advantages of the invention, as well as the details of illustrative embodiments, will be more fully understood from the following detailed description of the drawings, in which.

Figures 1, 2, 3:
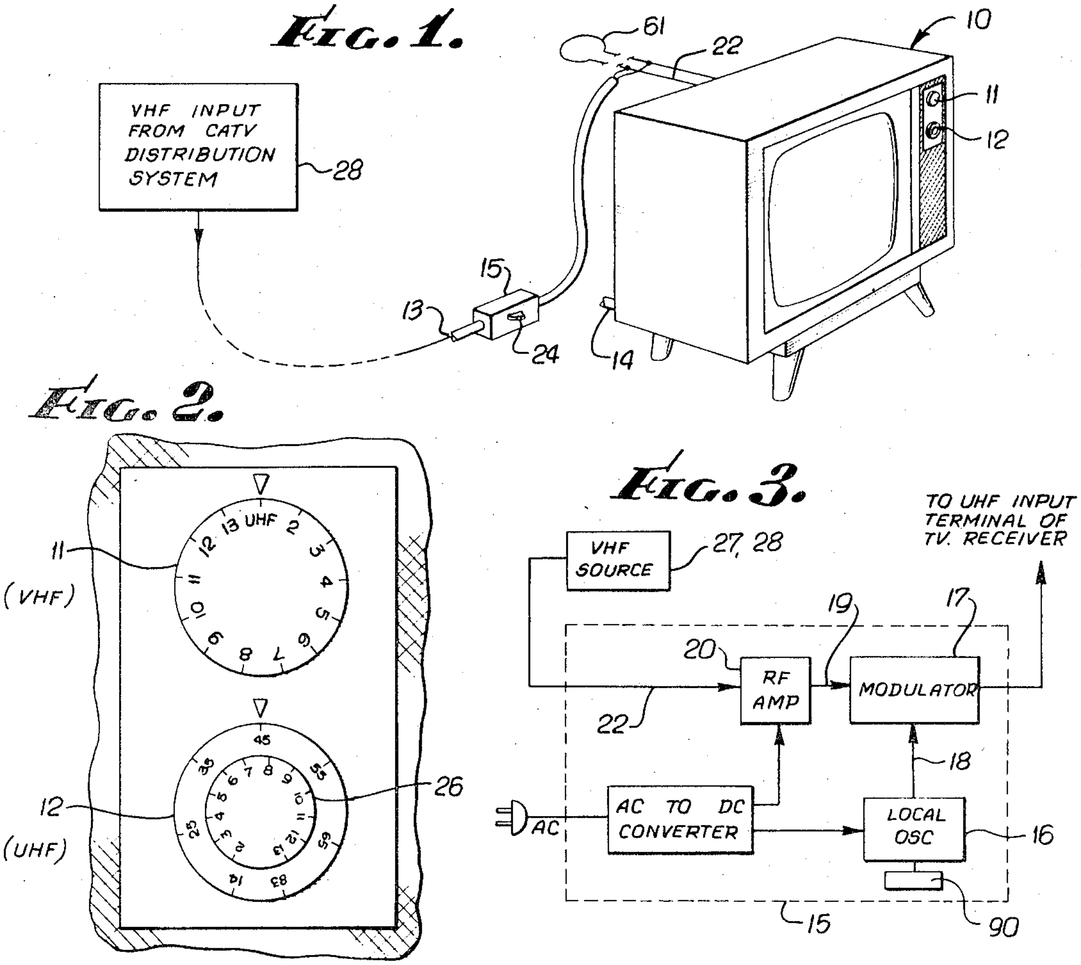
FIG. 1 is a view showing a television receiver incorporating the invention.
FIG. 2 is an enlarged frontal view of the UHF and VHF tuners of the FIG. 1 receiver.
FIG. 3 is a block diagram showing the VHF to UHF converter of the invention in block diagram form.

Referring first to FIGS. 1 and 2 the television receiver 10 incorporates VHF and UHF channel tuners which may include the rotary manual control knobs 11 and 12. Means including a coaxial cable 13 is connected for transmitting VHF signals toward the receiver input terminal, such a cable being for example embodied in a community antenna television (CATV) system. In this regard, the receiver has a VHF input terminal 14 and a UHF input terminal 22.

Summarizing the operation of the receiver itself, which is conventional, the sound and video R-F signals are handled at first together by conventional superheterodyne receiving circuits. The desired television channel is selected by tuned circuits and the sound and video signals are strengthened together by a radio-frequency amplifier with sufficient bandwidth to pass both carriers and their modulation sidebands. The R-F signal then heterodynes in the mixer with a locally generated frequency to produce a lower intermediate frequency equal to the difference between the two signals (usually 45.75 mc. for the picture). The sound and video I-F signals are amplified by several stages of I-F amplification and then applied to a video detector.

The video detector has two functions: (1) it demodulates the composite video signal by means of a diode detector, just is is done in an AM broadcast receiver; (2) it separates the sound and video I-F signals. The separation of sound and video is accomplished by beating together (heterodyning) the frequency-modulated sound I-F signal and the amplitude-modulated video I-F signal, which are spaced 4.5 mc. apart. Because of the detector's partially non-linear characteristic it performs this mixing function automatically. The heterodyning produces a 4.5 mc. frequency-modulated difference frequency, which is the sound I-F signal. Filter circuits in the output of the detector separate this 4.5 mc. sound I-F signal from the demodulated composite video signal.

The sound I-F signal is applied to the separate sound portion of the receiver, which is identical to the corresponding circuits in an FM broadcast receiver. The sound signal passes in succession through an I-F amplifier, a limiter and discriminator, or a ratio detector, one or two stages of audio amplification and a loudspeaker.

The demodulated composite video signal from the output of the video detector is applied to the video portion of the receiver. The video signal is amplified by a video amplifier and then reassembled by an electronic beam into a visible image on the face of the picture tube or kinescope. The composite video signal is also fed to a "sync" separator where the synchronizing signals are separated from the remainder of the video signal. The sync signals are then applied to the beam deflection circuits to keep the electronic beam that reassembles the image on the picture tube in step with the scanner at the transmitter.

The invention includes what may be referred to as means connected in series between the cable 13 and receiver input terminal 22 for converting VHF signals to UHF signals so that the UHF tuner may be operated to tune the VHF channels for display by the receiver picture tube. In this regard, the channels 2 to 6 before conversion occupy the VHF band from 54 to 88 megacycles while channels 7 to 13 occupy the VHF band from 174 to 216 megacycles. The UHF band accommodating channels 14 to 83 extends from 470 to 890 megacycles. Typically, the converter means referred to places VHF channels 2–13 within the UHF band from 490 to 656 megacycles, thereby eliminating the problems referred to in the introduction.

As seen in FIGS. 1 and 3, the converter unit 15 may include a local oscillator 16, and modulator 17 having an input at 18 to receive the output from the local oscillator and another input at 19 to receive versions of the VHF signals. The oscillator output frequency is such that the modulator output is within the UHF band, and typically the oscillator output frequency may be about 440 megacycles. The modulator may be of so-called balanced type, as for example is represented by Model 16514A produced by Hewlett Packard Company.

The converter may include an R-F amplifier 20 connected via input terminal 22 to receive the VHF signals from the cable and to supply amplified versions of such signals to the modulator input 19. Such an amplifier is represented by Model 562–F produced by the Viking Company. Other amplifiers and modulators are of course usable so long as they perform the functions referred to. The UHF pick-up antenna 61 at the receiver may be disabled or disconnected, as indicated.

FIG. 2 shows the provision of VHF channel indicators at the UHF tuner knob 12. Such indicators may be incorporated on a decal or other marker strip 26 attached to the knob 12. The UHF tuner is normally enabled when the VHF tuner knob is placed in the enabling position shown.

Finally, FIG. 1 illustrates a CATV distribution source 28 for VHF input to the cable inside the channels 2–13 range or both inside and outside that range. Thus, the invention enables use of more than 12 channels of VHF input, extending the utility of the receiver, inasmuch as the extra channels can be tuned by the UHF tuner, as described.

Figure 4:
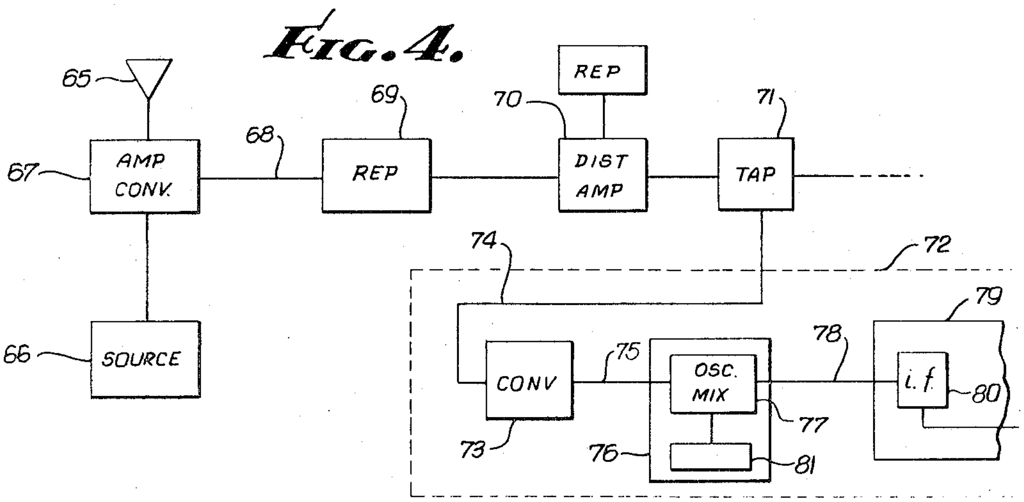
FIG. 4 is a block diagram showing another form of the invention.

Referring now to FIG. 4, the cable system illustrated includes means including an antenna 65 for picking up all channels between 2 and 83 (54 to 88 megacycles, 174–216 megacycles, and 470 to 890 megacycles. Also shown is a source 66 for other channels. The antenna 65 and source 66 have connection with amplifier and converter equipment 67, the latter serving to convert selected channels to the 5–250 megacycle band for transmission on the coaxial cable 68. Suitable repeaters 69 and distributed amplifiers 70 are connected with the cable, as indicated.

From a tap 71, cable signals are led at 74 into a customer's home 72 and to a converter 73 of the same type referred to above at 15, the converter operating to convert the 5–250 megacycle cable signals to signals entirely within the UHF (say 470–730 megacyce) band, for example. From the converter 73, the signals are passed at 75 to an auxiliary UHF tuner 76 that incorporates mixer and oscillator circuits as described above, and the output of which is passed at 78 to the existing receiver 79, and typically to the I.F. stage 80 thereof, as indicated. Connection 78 may lead to the mixer tube socket of the older type television receivers lacking a UHF tuner, whereas if the receiver 79 incorporates a UHF tuner, the connection 78 may pass to the UHF input of the VHF tuner on such a receiver. In either event, tuning is accomplished by means of the auxiliary UHF tuner 76 shown as incorporating the manual control 81, whereby all incoming channels may be tuned—as for example between channels 2 and 83. The auxiliary UHF tuner 76 may be appropriately mounted at the existing receiver 79. Accordingly, this system has the advantage of overcoming any calibration problems that might otherwise arise as a result of using the existing UHF tuner at the receiver.

Referring back to FIG. 3, it is also possible to tune the oscillator 16 in the converter 15, as by means of manual control knob 90, while holding the UHF tuner knob 12 fixed thereby to accomplish both VHF and UHF tuning.

We claim:

1. In combination, a television receiver having VHF and UHF tuning means for tuning VHF and UHF channels, the receiver also having one input terminal for VHF and another input terminal for UHF, transmitting means including a coaxial cable connected for transmitting multiple channel VHF signals toward said UHF terminal, and means connected in series between said cable and said UHF terminal for converting said VHF signals to UHF signals so that the UHF tuning means may be operated to tune said VHF channels for display by the receiver picture tube.

2. The combination of claim 1 in which said UHF tuning means includes an originally installed and disabled UHF tuner and an auxiliary UHF tuner operatively connected between said converting means and the receiver I.F. stages.

3. The combination of claim 1, in which said transmitting means includes means to transmit to the cable VHF signals inside and outside the channel 2–13 frequency range, said cable extending to said converter means.

4. The combination of claim 1, in which said transmitting means transmits both UHF and VHF input signals to the cable, the transmitting means including other converter apparatus to convert the UHF and VHF input to the cable to signals within the 5–250 megacycle band for transmission by the cable.

5. The improvement as defined in claim 4, in which said converting means includes an RF amplifier connected to receive the VHF signals from said cable and to supply amplified versions thereof to said modulator means.

6. The combination of claim 1, including a CATV distribution system tap, said cable extending between said tap and said converting means, and in which said converting means includes a local oscillator and modulator means having an input to receive the output from the oscillator and another input to receive versions of said VHF signals, the oscillator output frequency being such that the modulator output is within the UHF band.

7. The combination of claim 6, in which said converting means includes an RF amplifier connected to receive the VHF signals from said cable and to supply amplified versions thereof to said modulator means.

8. The combination of claim 6 including VHF channel indicators at said UHF tuning means.

9. The combination of claim 6, in which said oscillator has a manual tuning control.

10. For combination with a television receiver having VHF and UHF tuning means for tuning VHF and UHF channels, the receiver also having one input terminal for VHF and another input termnal for UHF, with means including a coaxial cable connected for transmitting VHF signals toward said UHF terminal, the improvement comprising means connectible between said cable and said UHF terminal for converting said VHF signals to UHF signals so that the UHF tuning means may be operated to tune said VHF channels, said converting means including a local oscillator and modulator means having an input to receive the output from the oscillator and another input to receive versions of said VHF signals, the oscillator output frequency being such that the modulator output is within the UHF band.

11. In combination, a television receiver having VHF and UHF tuning means for tuning VHF and UHF channels, the receiver also having an input terminal for UHF channel input, transmitting means including a coaxial cable connected for transmitting VHF signals toward said terminal, means connected in series between said cable and said terminal for converting said VHF signals to UHF signals, said last named means including a single local oscillator and modulator means having an input to receive the output from the oscillator and another input to receive said VHF signals, the oscillator output frequency being variable within a range such that the modulator output is variable within the UHF band, and auxiliary manually controllable means to tune the oscillator to vary said output frequency thereof within said range.

12. The method of operating a televiison receiver having VHF and UHF tuning means for tuning VHF and UHF channels, the receiver also having one input terminal for VHF and another input terminal for UHF, that includes (a) transmitting multiple channel VHF signals over a coaxial cable toward said receiver, (b) converting said VHF signals to UHF signals proximate the receiver, (c) transmitting said UHF signals to said UHF terminal, (d) and operating said receiver and UHF tuner to select the VHF channel to be displayed by said receiver.

13. The method of claim 12 including the step of freeing the UHF terminal of connection to any local UHF antenna.

14. The method of claim 12 including operating remote antenna means to pick up signals on television channels between 2 and 83, and converting said signals to said multiple channel VHF signals in the 5–250 megacycle band for transmission over said cable.

15. The method of operating a television receiver having VHF and UHF tuning means for tuning VHF and UHF channels, the receiver also having one input terminal for VHF and another input terminal for UHF, that includes (a) transmitting multiple channel VHF signals over a coaxial cable toward said receiver, (b) mixing amplified versions of said VHF signals with signals from a local oscillator to derive UHF signals proximate the receiver, (c) transmitting said UHF signals to said UHF terminal, and (d) operating said receiver and adjusting the frequency output of said local oscillator to select the VHF channel to be displayed by said receiver.

16. The method of claim 15 including operating remote antenna means to pick up signals on television channels between 2 and 83, and converting said signals to said multiple channel VHF signals in the 5–250 megacycle band for transmission over said cable.

References Cited

UNITED STATES PATENTS

| | | | |
|---|---|---|---|
| 2,559,613 | 7/1951 | Halstead | 325—308 |
| 2,831,105 | 4/1958 | Parker | 325—308 |
| 2,854,506 | 9/1958 | Pickles | 178—6P.D. |
| 3,333,198 | 7/1967 | Mandell | 325—308 |

ROBERT L. GRIFFIN, Primary Examiner

H. W. BRITTON, Assistant Examiner

U.S. Cl. X.R.

178—6; 325—308